United States Patent [19]

Hannappel et al.

[11] Patent Number: 4,833,472
[45] Date of Patent: May 23, 1989

[54] SYSTEM FOR SETTING AN ANALOG RESISTOR TO A SELECTABLE, DIGITALLY PREDETERMINABLE VALUE

[75] Inventors: Joachim Hannappel, Waldbrunn; Thomas Pfeifer, Eppstein, both of Fed. Rep. of Germany

[73] Assignee: VDO Adolf Schindling AG, Frankfurt am Main, Fed. Rep. of Germany

[21] Appl. No.: 82,856

[22] Filed: Aug. 5, 1987

[30] Foreign Application Priority Data

Sep. 13, 1986 [DE] Fed. Rep. of Germany ....... 3631285

[51] Int. Cl.[4] ............................................. H03M 1/66
[52] U.S. Cl. .................................... 341/142; 341/118; 341/144
[58] Field of Search ................. 340/347 CC, 347 DA; 341/118, 142, 144

[56] References Cited

U.S. PATENT DOCUMENTS 4,126,852 11/1978 Baertsch ...................... 340/347 DA
4,168,492 9/1979 Uya .............................. 340/347 DA

OTHER PUBLICATIONS

"Halbieiter-Schaltungstechnik"; Funfte, Uberarbeitete Auflage; Mit 821 Abbildungen; Springer-Verlag; 1980.

Primary Examiner—William M. Shoop, Jr.
Assistant Examiner—Richard K. Blum
Attorney, Agent, or Firm—Martin A. Farber

[57] ABSTRACT

An arrangement for setting an analog resistor to a value which is digitally predetermined. The arrangement contains a resistor (2) which is variable by a control voltage as setting member of a control circuit, in series with a measurement resistor (3) and a rotary-magnet ratio meter (26). This series connection is fed from an operating voltage. The voltage at the measurement resistor (3) and the digital value are each fed to inputs of a multiplier (5) the outputs of which are connected via a digital/analog converter (6) to an input of a subtraction circuit (7). The other input of the subtraction circuit (7) is acted on by a reference voltage. The output of the subtraction circuit (7) produces the control voltage for the adjustable resistor (2).

12 Claims, 1 Drawing Sheet

SYSTEM FOR SETTING AN ANALOG RESISTOR TO A SELECTABLE, DIGITALLY PREDETERMINABLE VALUE

FIELD AND BACKGROUND OF THE INVENTION

The present invention refers to a system for setting an analog resistor to a selectable value which is predetermined digitally.

For certain cases of use, resistance values which have been produced in digital form must be used in order to set analog resistors. Digital values result, for instance, upon calculation by means of microcomputers.

SUMMARY OF THE INVENTION

It is an object of the invention to provide a simple system for setting an analog resistor to a selectable, digitally predeterminable value.

According to the invention, a resistor (2) which can be adjusted by a control voltage is connected as setting member in a control circuit in series with the measurement resistor (3) to an operating voltage, and the voltage on the measurement resistor (3) and the digital value are fed to different inputs of a multiplier (5) the outputs of which are connected via a digital/analog converter (6) to an input of a subtraction circuit (7), the other input of which is acted on by a reference voltage and the output of which produces the control voltage for the variable resistor (2).

In this arrangement a desired resistance value is set by means of the current flowing over the variable resistor and the measurement resistor.

The voltage drop ($V_2$) over the measurement resistor (3) is preferably applied via a non-invertingly connected difference amplifier (12) to the input of the multiplier (5). Due to the amplification, a low voltage on the measurement resistor is sufficient for adjusting the resistor to the desired value. As a result of the low voltage, the value of the measurement resistor can also be kept low. By the low resistance value, the resistance of the series circuit consisting of variable resistor and measurement resistor is determined predominantly by the variable resistor, i.e. the measurement resistor affects the setting range of the total resistance only to a negligibly small extent.

The variable resistor is preferably an MOS field-effect transistor. This transistor requires only a small control current so that the power requirement for the control circuits is small.

In a preferred embodiment, the multiplier (5) consists of a number of analog switches which are acted on, on the input side, by a voltage which is proportional to the voltage on the measurement resistor (3), the number of said switches corresponding to the number of parallel places of the digital word associated with the resistance and which switches are conductive or non-conductive as a function of the corresponding binary place value, each of the outputs of the switches being connected to an evaluation resistor of the digital/analog converter (15). With this arrangement, a multiplication between the digital word and the voltage which is proportional to the voltage drop on the measurement resistor is obtained by simple means.

The analog switches, which preferably contain CMOS field-effect transistors, are advisedly each arranged in series with the evaluation resistors of an R-2R network of the digital-analog converter (15). In this way, a very simple circuit construction is obtained.

It is favorable to develop the subtraction circuit (7) as a difference amplifier (16) whose non-inverting input is acted on by a lower voltage derived from the operating voltage of the variable resistor (2). The analog resistance is in this case held at the digital value which has once been predetermined, independently of variations in the operating voltage.

In another favorable embodiment, inverting members are connected in each case in front of the control inputs of the analog switches, they being each acted on by a value associated with a binary place of the digital word for the resistance. The complement formation is carried out with the inverting members.

Further according to the invention, a capacitor (25) is arranged between the gate electrode and the drain electrode of the variable resistor (2), which is developed as an MOS field-effect transistor (18).

Still further acocrding to the invention, a resistor (22) is connected in parallel to the drain-source path of the field-effect transistor (18).

Also according to the invention, another capacitor (23) is arranged between the drain electrode of the field-effect transistor and the second pole of the source of operating voltage (4).

Further according to the invention, the variable resistor (2) and the measurement resistor (3) are connected in series with a winding of a ratio-meter to the source of operating voltage.

Still further, the ratio-meter is a rotary-magnet ratio-meter (26).

Further details, advantages and features of the invention will be evident not only from the claims and the features which can be noted from them, either individually or in combination, but also from the following description of an embodiment shown in the drawing.

DETAILED DESCRIPTION OF THE PREFERRED EMBODIMENT

Figure 1:
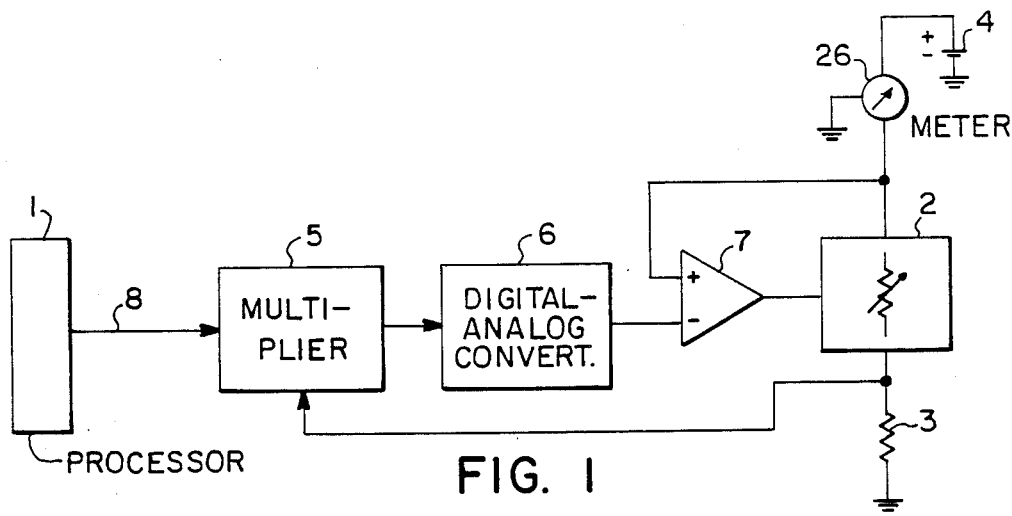
FIG. 1 is a block diagram of a system for the setting of an analog resistor to a selectable value which is digitally predetermined.

A processor 1 produces digital values on, for instance, eight parallel outputs, said values to be converted in an adjustment of the value of an analog resistor. A variable analog resistor 2 is arranged as setting member of a control circuit in series with a measurement resistor 3 and a rotary-magnet ratio-meter 26 between the poles of an operating voltage 4. The analog resistor consisting of the series connection of resistor 2 and measurement resistor 3 is to be set to the measurement resistance predetermined by a digital value. The eight parallel outputs of processor 1 are connected to inputs of a multiplier 5, not shown in detail in FIG. 1, the multiplier being acted on at a further input by the voltage drop over the measurement resistor 3.

This voltage is multiplied in each case by the binary values at the parallel outputs of processor 1. If one or more places of the digital word on the parallel outputs of processor 1 bear in each case a binary "0", then the binary values "0" appear on the corresponding output of the multiplier 5. At those place of the digital word which bear binary values of "1", there result on the corresponding outputs of multiplier 5 voltages which are equal or at least proportional to the voltage on measurement resistor 3. The eight outputs, not shown in detail, of multiplier 5 are connected to corresponding inputs of a digital/analog converter 6 the output of which is connected to an input of a subtraction circuit 7 while the other input is acted on by a voltage which is tapped off at one input of the rotary-magnet ratio-meter 26. The output of subtraction circuit 7 supplies the control voltage for the setting of resistor 2. The digitally predetermined resistance is set by means of the current flowing over resistor 2 and measurement resistor 3, in the manner that the voltage at the measurement resistor, which is proportional to the current, is multiplied by the digital word of the resistor. From this there is obtained a value proportional to the digital resistance and the current and which, after digital/analog conversion, is subtracted from a reference voltage. The voltage difference adjusts the resistance in such a manner that the voltage difference is a minimum. This is the case when the ratio of voltage and current in the branch containing measurement resistor 3 and resistor 2 corresponds to the digitally predetermined resistance.

Figure 2:
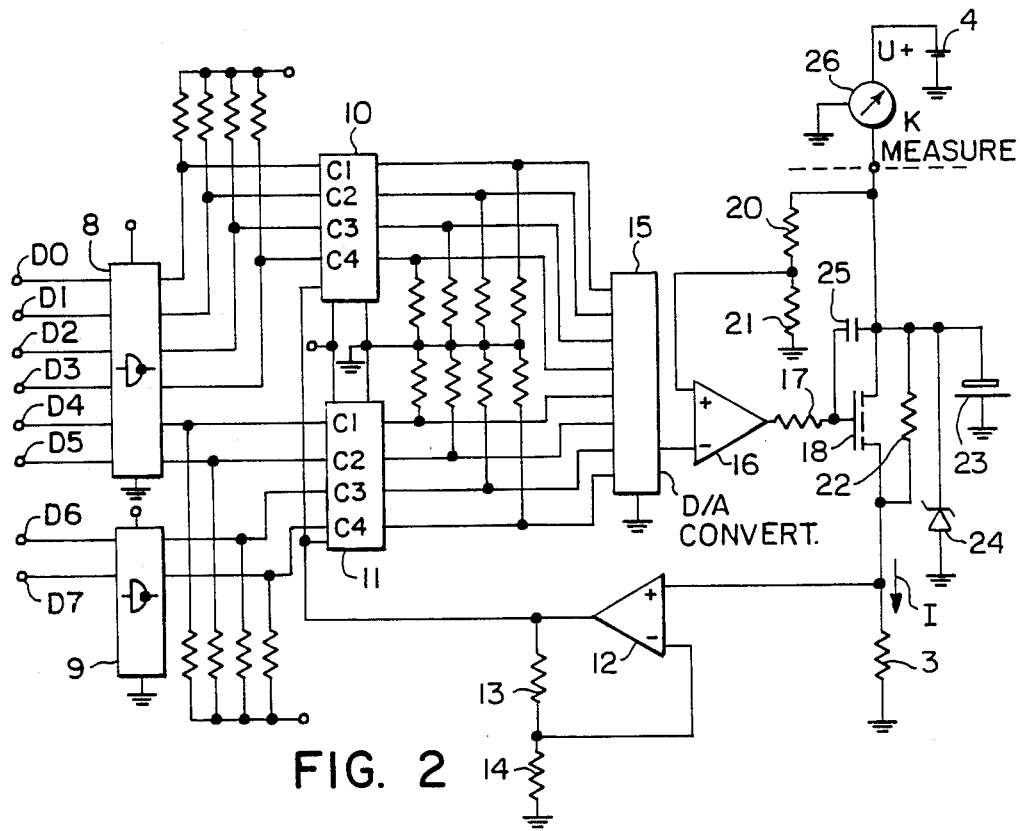
FIG. 2 is a detailed circuit diagram of a system for setting an analog resistor to a selectable value which is digitally predetermined.

FIG. 2 shows a circuit arrangement with eight inputs, designated $D_0$ to $D_7$. A binary value is applied as digital value of a resistance to these eight inputs $D_0$ to $D_7$. The inputs $D_0$ to $D_5$ are connected in each case to inputs of invertor members of a first integrated circuit 8. The inputs $D_6$ and $D_7$ are each connected to an input of a second digital integrated circuit 9. Commercially available components of type 7416 are preferably used as integrated circuits 8, 9.

Those outputs of the invertor members of the circuits 8, 9 which are connected on the input side are connected in each case to an working voltage via operating resistors not designated in further detail. Furthermore, four outputs of the circuit 8 are each connected with control inputs of four contact-less switches arranged in an integrated circuit 10, the switches containing CMOS field-effect transistors. Two invertor members of each of the circuits 8, 9 connected on the input side are furthermore connected to the control input of a contactless switch arranged in an integrated circuit (11), said switch containing CMOS field-effect transistors. Circuits 10, 11 are preferably the components which are available commercially as type HEF 4066. Inputs of the contact-less switches of circuits 10, 11 are connected jointly to the output of a difference amplifier 12 which is connected as non-inverting amplifier and is connected on the output side to two resistors 13, 14 connected in series, the tap point of which is connected to the inverting input of difference amplifier 12.

The noninverting input of difference amplifier 12 is connected to measurement resistor 3. The four outputs of circuits 10, 11 are each connected via working resistors, not shown in detail, which are at ground potential to inputs of a digital/analog converter 15 wich comprises in the present case a resistance network, an R-2R network, which is known per se. The contact-less switches of the circuits 10, 11 are each arranged in series with one of the resistors of the R-2R network. The connections are so selected that the weighting of the network corresponds to the value of the places of the digital word.

The output of the digital/analog converter 15 is connected to the inverting input of a difference amplifier 16 the output of which is connected via a resistor 17 to the gate electrode of an MOS field-effect transistor 18 which serves as variable resistor 3. The drain electrode is connected via a branch of a rotating-magnet ratio-meter 26 to the one pole of the source of operating voltage 4, the other pole of which is connected to ground. A voltage divider consisting of two series-connected resistors 20, 21 is arranged between the connection of the rotary-magnet ratio meter 26 facing away from the pole of the source of operating voltage and the other pole of the source of operating voltage. The tap of the voltage divider is connected to the non-inverting input of difference amplifier 16. A resistor 22 is connected in parallel to the drain-source path of field-effect transistor 18. The drain electrode is furthermore connected to ground via a capacitor 23 and a zener diode 24. Another capacitor 25 is present between the drain electrode and the gate electrode.

The resistors 3, 13, 14, 20, 21, 22 are metal resistors so as to improve the precision.

A voltage designated $V_2$ occurs on the measurement resistor 3, said voltage being caused by a current designated I which flows through the field-effect transistor 18 and resistor 22.

The resistance of the arrangement consisting of field-effect transistor 18, resistor 22 and measurement resistor 3 results from the ratio of the operating voltage $V_1$ and the current I in accordance with the equation:

$$R = \frac{V_1}{I}$$

The voltage $V_2$ is amplified as follows by difference amplifier 12 by means of the values $R_{13}$ and $R_{14}$ of resistors 13, 14:

$$V_2 \cdot (1 + R_{13}/R_{14})$$

This voltage is multiplied by the digital word, i.e. those place which have binary "I" values in the circuits 10, 11 are multiplied by the voltage $$V_2 \cdot (1 + R_{13}/R_{14})$$

so that the resistors of the digital/analog converter 15 are acted on by a corresponding difference voltage. However, it is not the digital value which is associated with the resistance which is present at the eight inputs of circuits 10, 11 but its complementary values. If the digital word at the inputs of circuits 10, 11 is designated D, then the following relationship exists between the digital word produced at inputs $D_0$–$D_7$ and the digital word designated $D_{In}$:

$$D = 256 - D_{In}$$

On the non-inverting input of the difference amplifier 16 there is then present a voltage which is dependent as follows on the values $R_{20}$ and $R_{21}$ of resistors 20, 21:

$$\frac{V_1 \cdot R_{20}}{R_{20} + R_{21}}$$

The output voltage of the digital/analog converter 15 is maintained at approximately the value $$\frac{V_1 \cdot R_{20}}{R_{20} + R_{21}}$$

by the control circuit.

For the resistance R of the circuit consisting of field-effect transistor 18, parallel resistor 22 and measurement resistor 3 there results the following approximation equation:

$$R = \frac{V_1}{I}, \text{ i.e. } R = R_2 \cdot D \cdot \frac{b \cdot k}{a}$$

In this equation $b = 1 + \frac{R_{13}}{R_{14}}$

For the value $a$ we have:

$$a = \frac{R_{20}}{R_{20} + R_{21}}$$

For the value $k$ we have:

$$k = \frac{1}{512}$$

based on the constants of the digital/analog converter 15.

A suppression of oscillation is obtained by the capacitors 23, 25. The zener diode 24 limits the voltage present on field-effect transistor 18 to a safe value, which is intended for the protection of the output.

The arrangement consisting of field-effect transistor 18, parallel resistor 22 and measurement resistor 3 is preferably arranged in a branch of a ratio meter.

Since the voltage $V_2$ is amplified, the measurement resistor 3 can have a very small value. For the resistance of the arrangement consisting of field-effect transistor 18, resistor 22 and measurement resistor 3, essentially only the field-effect transistor 18 in combination with the parallel-connected resistor 22 is then of importance. Parallel resistor 22 determines the upper limit of the resistance when field-effect transistor 18 is completely blocked.

Figure 3:
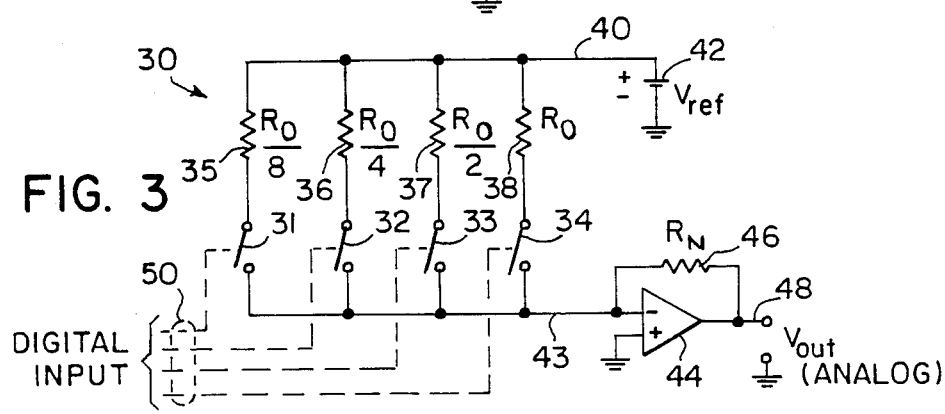
FIG. 3 is a digital-to-analog converter.

FIG. 3 shows a digital-to-analog convertor 30 in the form referred to herein as an R-2R network. The converter 30 comprises four switches 31, 32, 33 and 34 which are serially connected, respectively, to four scaling resistors 35, 36, 37 and 38 between a positive terminal 40 of a reference voltage source 42 and a negative input terminal 43 of a feedback amplifier 44. Also included within the converter 30 is a feedback resistor 46 connected between an output terminal 48 of the amplifier 44 and the negative input terminal 43. The switches 31–34 are electronic switches (such as transistor switching circuits) activated in response to the logic level of the binary digits of a digital signal applied via input lines 50.

In operation, an output analog voltage is provided between terminal 48 and ground, the analog voltage being proportional to the magnitude of the reference voltage, and the ratio of the feedback resistor 46 to a selected one of the scaling resistors 31–34. An individual one or more of the scaling resistors 31–34 are selected by closing respective ones of the switches 35–38 by the input digital signal. The output analog voltage is then the sum of the voltage contributions provided by the selected scaling resistors. As indicated in FIG. 3, the scaling resistors have magnitudes of resistance which vary in geometric progression by factors of two to provide analog voltages corresponding to the bits of the digital input signal. The foregoing circuit of the convertor 30 is disclosed in Publication, Halbleiter-Schaltungstechnik, Funfte, uberarbeitete Auflage, Mit 821 Abbildungen, Springer-Verlag; Berlin, Heidelberg, New York 1980 and is incorporated by reference.

With reference to FIG. 2, the network of resistors 35, 36, 37 and 38 is the R-2R network. The switches 31, 32, 33 and 34 serve as the contactless switches of the circuits 10 and 11.

We claim:

1. A system for setting an analog resistor to a selectable value which is predetermined digitally in response to a digital value, comprising:
   a control circuit including variable resistor means and a measurement resistor;
   a source of operating voltage and a source of reference voltage;
   means for entering the digital value;
   multiplying means having first and second input terminals and being responsive to said digital value, said digital value being provided as an input signal to said multiplying means;
   a digital-to-analog converter, and a subtraction circuit having two input terminals; and wherein
   said variable resistor means is adjustable by a control voltage and is connected as a setting element in series with said measurement resistor to said operating voltage, a voltage drop across the measurement resistor and said digital value are fed respectively to said first and second input terminals of said multiplying means, an output of said multiplying means is connected via said digital/analog converter to one input of said subtraction circuit, a second input of said subtraction circuit receives said reference voltage, and an output of said subtraction circuit produces the control voltage for said variable resistor means.

2. The system according to claim 1, further comprising a difference amplifier; and wherein
   a voltage drop ($V_2$) across said measurement resistor is connected to a noninverting input of said difference amplifier, and applied via said difference amplifier to the first input of the multiplying means.

3. The system according to claim 2, wherein said multiplying means comprises
   a plurality of analog switches receiving a voltage which is proportional to the voltage drop on the measurement resistor, the number of said switches corresponding to the number of parallel places of said digital value; and wherein
   individual ones of said switches have two states to be conductive or non-conductive as a function of the corresponding binary place value, the switches having outputs connected to an evaluation resistor of said digital/analog converter.

4. The system according to claim 1, wherein said multiplying means comprises
   a plurality of analog switches receiving a voltage which is proportional to the voltage drop on the measurement resistor, the number of said switches corresponding to the number of parallel places of said digital value; and wherein
   individual ones of said switches have two states to be conductive or non-conductive as a function of the corresponding binary place value, the switches have outputs connected to an evaluation resistor of said digital/analog converter.

5. The system according to claim 4 wherein said analog switches comprise CMOS field-effect transistors, and said converter comprises an R-2R network, said switches being connected in series with evaluation resistors of said R-2R network of the digital-analog converter.

6. The system according to claim 1 wherein said subtraction circuit is developed as a difference amplifier with a non-inverting input responsive to a voltage provided by operation of said variable resistor means.

7. The system according to claim 4, wherein inverting means are connected to respective control inputs of the analog switches to activate the respective switches in response to a value associated with a binary place of the digital value.

8. The system according to claim 1 wherein said control circuit further comprises
a capacitor; and wherein
said variable resistor means is developed as an MOS field-effect transistor, said capacitor being coupled between the gate electrode and the drain electrode of the transistor of said resistor means.

9. The system according to claim 8 wherein said control circuit further comprises
a resistor connected in parallel to the drain-source path of the field-effect transistor of said resistor means.

10. The system according to claim 9 further comprising another capacitor connected between the drain electrode of the field-effect transistor of said resistor means and a terminal of said source of operating voltage.

11. The system according to claim 1 further comprising a ratio-meter; and wherein
said variable resistor means and said measurement resistor are connected in series via a winding of said ratio-meter to said source of operating voltage.

12. The system according to claim 11 wherein said ratio-meter is a rotary-magnet ratio-meter.

* * * * *